United States Patent [19]
Kamiya et al.

[11] Patent Number: 4,644,298
[45] Date of Patent: Feb. 17, 1987

[54] PROXIMITY SWITCH

[75] Inventors: Fumio Kamiya, Nagaokakyo; Hisatoshi Nodera, Kusatsu; Kenji Ueda, Otsu; Keinosuke Imazu, Takatsuki; Hidehiro Tomioka, Kyoto, all of Japan

[73] Assignee: Omron Tateisi Electronics Co., Kyoto, Japan

[21] Appl. No.: 759,988

[22] Filed: Jul. 29, 1985

[30] Foreign Application Priority Data

Jul. 27, 1984 [JP] Japan ................. 59-157913

[51] Int. Cl.$^4$ ............................... H03B 5/12
[52] U.S. Cl. ................. 331/65; 331/117 R; 331/167; 324/236
[58] Field of Search ............ 331/65, 117 R, 167; 324/207, 208, 226, 236; 340/568, 686

[56] References Cited

U.S. PATENT DOCUMENTS 3,732,503  5/1973  Rapp et al. ............ 331/117 R X
4,543,527  9/1985  Schuchmann et al. ....... 331/65 X

FOREIGN PATENT DOCUMENTS 0065649  12/1982  European Pat. Off. .
1272363   8/1969  Fed. Rep. of Germany .
2722510  11/1978  Fed. Rep. of Germany .
2815711   1/1980  Fed. Rep. of Germany .
0002575   1/1981  Japan ....................... 331/65
0157636   9/1982  Japan .
0199332  12/1982  Japan .
2069141   8/1981  United Kingdom .
2075201  11/1981  United Kingdom .

Primary Examiner—Eugene R. LaRoche
Assistant Examiner—Robert J. Pascal
Attorney, Agent, or Firm—Wegner & Bretschneider

[57] ABSTRACT

Disclosed is a proximity switch which includes a current feedback time oscillator so that an object in proximity may be detected from the decline in the oscillation output. In order to increase the recovery speed of the oscillation which has dropped as a result of detecting an approaching object, in addition to a first comparison circuit for detecting the object from the oscillation output level, a second comparison circuit is provided for varying the feedback current to the oscillation circuit to the end of maintaining the oscillation level at a certain low level even when the object has come sufficiently close to the proximity switch to otherwise completely terminate the oscillation. By virtue of the increased response speed of the proximity switch, it may be used in an environment where a strong AC magnetic field is present.

3 Claims, 6 Drawing Figures

PROXIMITY SWITCH

TECHNICAL FIELD

This invention relates to a proximity switch of high frequency oscillation type with an improved response speed in detecting an object.

BACKGROUND OF THE INVENTION

A proximity switch of high frequency oscillation type has a detection coil in its detection head and an oscillation circuit is formed therein using the detection coil as an oscillation coil, so as to detect an object from the decline in the oscillation output due to the decline in the inductance of the oscillation coil.

One form of oscillation circuit of current feedback type which may be used in a proximity switch is given in FIG. 4. In this drawing, an oscillation circuit is formed by connecting a capacitor C in parallel to a detection coil L which is provided in the front part of the proximity switch. This LC resonance circuit receives electric current from a constant current source 2 by way of a power source 3 and an end thereof is connected to a transistor 4 for current amplification. The emitter of the transistor 4 is grounded by way of a variable resistor 5 which determines the collector current, and a current mirror circuit CM1 consisting of a pair of transistor 6 and 7 is connected to the collector of the transistor 4.

The current produced from the LC resonance circuit is current amplified by the transistor 4 and a current of the same amplitude as the collector current is current fed back by the current mirror circuit CM1 to the LC resonance circuit by way of the transistor 7. On account of this positive current feedback, the LC resonance circuit starts an oscillation at its resonance frequency.

According to this oscillation circuit, the speed of termination of the oscillation may be varied by adjusting the shape and winding of the detection coil L and changing other circuit constants. However, when an object approaches the detection coil and increases the conductance of the detection coil, the oscillation is terminated sooner or later. Therefore, the response speed of a proximity switch may be considered as the total time of the start and the termination of oscillation. Generally speaking, oscillation of an oscillation circuit is extremely slow in rise (start) speed but is relatively fast in termination speed. The time tau required for oscillation to start, grow and reach a level which enables the detection of an object may be given as follows:

$$t_{au} = \frac{2c}{g} \ln \frac{V_o}{V_s} \quad (1)$$

where
Vo : Output reversion level
Vs : Amplitude level at the beginning of oscillation
C : Capacitance of the resonance capacitor
g : Variation of conductance from the beginning of oscillation.

Generally, the amplitude level at the termination of oscillation is a noise level which is, for instance, in the order of mV's. As the detection distance is increased, the conductance variation decreases and the response speed decreases, causing the problem that the detection of a fast moving object becomes impossible. To avoid such a problem, a proposal has been made to provide a initialization signal generator for giving an initialization signal to the oscillator circuit (Japanese Patent Laying-Open Publication No. 58-1327), but the initialization signal must be matched to the oscillation frequency and the circuitry tends to be complicated.

Furthermore, in an environment where a strong AC magnetic current is present as in a resistance welder which involves an electric current of more than ten thousand A, the ferrite core of the detector coil is saturated and, due to the increase in the loss in the detection coil, the oscillation is interrupted. Therefore, in such an environment, a conventional proximity switch of high frequency oscillation type may become unusable.

SUMMARY OF THE INVENTION

In view of such problems of conventional proximity switches, a primary object of this invention is to provide a proximity switch which has a high response speed through speed up in the start of oscillation.

A second object of this invention is to provide a proximity switch which is capable of withstanding a strong magnetic field so that it may be used in an environment where a strong AC magnetic field is present, such as in a resistance welder.

According to this invention, such objects are accomplished by providing a proximity switch of high frequency oscillation type having a current feedback type oscillation circuit in which part of oscillation current is fed back, and a detector circuit which detects an object from reduction in oscillation output, characterized in that: the current feedback type oscillation circuit comprises a current mirror circuit consisting of a first transistor producing an oscillation current and a second transistor; a multi-collector transistor having a base connected to a collector of the first transistor, and an emitter receiving a mirror current from the second transistor; the mirror current being divided by its collectors to use part thereof as feedback current; a second current mirror circuit receiving other collector current from the multi-collector transistor; a third transistor which feeds back the output current of the second current mirror circuit along with the feedback current of the multi-collector transistor; and a switching device for suppressing the second current mirror circuit; the proximity switch further comprising a first comparison means for producing an object detection signal when the oscillation output of the oscillation circuit has declined below a first level, and a second comparison circuit which deactivates the switching device when the oscillation output of the oscillation circuit has declined below a second level which is lower than the first level.

According to this invention which is thus characterized, when the oscillation output has further declined after the proximity switch has detected an object, this further decline is detected by the second comparison means and the second current mirror circuit is activated through deactivation of the switching device. Therefore, the current feedback is increased by the current mirror circuit and the oscillation may be maintained at a low level. And this current feedback may be easily varied by changing the number of the collectors of the multi-collector transistor for feedback. Furthermore, the base of the multi-collector transistor which divides the mirror current is connected to the collector of the transistor of the first current mirror circuit. Therefore, the feedback current changes very little even when the current gain is varied by temperature changes, and may be kept to a predetermined value. Therefore, the oscillation may be maintained in a stable manner while an object is detected in proximity. Thus, the resumption of oscillation after the object has left is immediate and the response speed of the proximity switch may be increased.

Moreover, because the response speed is fast, even in an environment where a strong AC magnetic field is present, the oscillation may be maintained near the zero cross point of the AC magnetic field in an intermittent manner. Therefore, by increasing the time constant of a smoothing circuit which produces an object detection signal, the proximity switch may become sufficiently resistant to magnetic field to be cable of detecting an object even in a very strong magnetic field.

BRIEF DESCRIPTION OF THE DRAWINGS

Now this invention will now be shown and described in the following in terms of a concrete embodiment thereof with reference to the appended drawings, in which.

DESCRIPTION OF EMBODIMENT(S)

Figure 1:
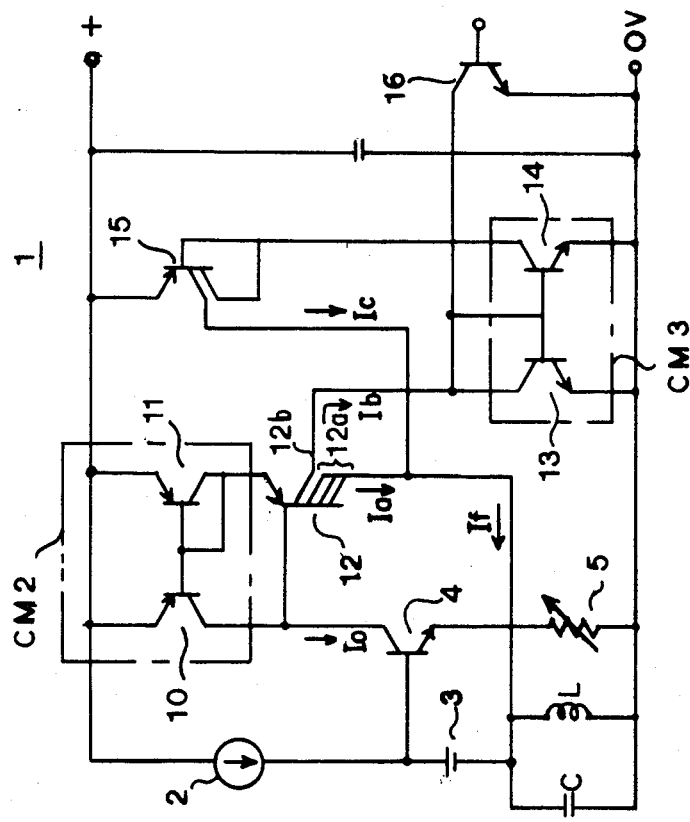
FIG. 1 is a circuit diagram of an embodiment of the oscillation circuit for the proximity switch according to this invention.
Figure 4:
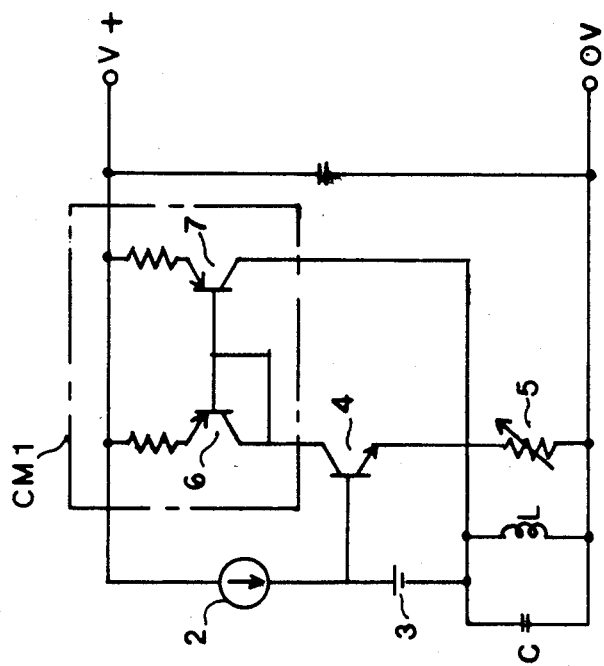
FIG. 4 is a circuit diagram showing a conventional oscillation circuit.

FIG. 1 is a circuit diagram of an embodiment of a proximity switch oscillation circuit according to this invention. In the description of this embodiment, the parts corresponding to those in the conventional art illustrated in FIG. 4 are denoted with like numerals.

In this embodiment, the collector of the transistor 4 is connected to a transistor 10 which forms a current mirror circuit CM2 in cooperation with another transistor 11. The emitter areas of these transistors 10 and 11 are selected to be identical to each other and the collector of the transistor 11 is connected to a multi-collector transistor 12 which has four collectors as shown in the drawing. The base of the multi-collector transistor 12 is connected to the collector of the transistor 10. Three of the collectors 12a of the multi-collector transistor 12 are connected in common for feedback to an LC resonance circuit while the remaining collector 12b is connected to the collector-base common terminal of an NPN transistor 13.

The transistor 13 forms a current mirror circuit CM3 in cooperation with another transistor 14 and the collector of the latter transistor 14 is connected to the base-collector common terminal of another multi-collector transistor 15. The other collector of this multi-collector transistor 15 is connected to the LC resonance circuit. The base and the collector of the transistor 13 are connected to the collector terminal of a switching transistor 16. The switching transistor 16 is turned off by a signal which is given when the oscillation output has increased and controls the action of the current mirror circuit CM3.

Figure 2:
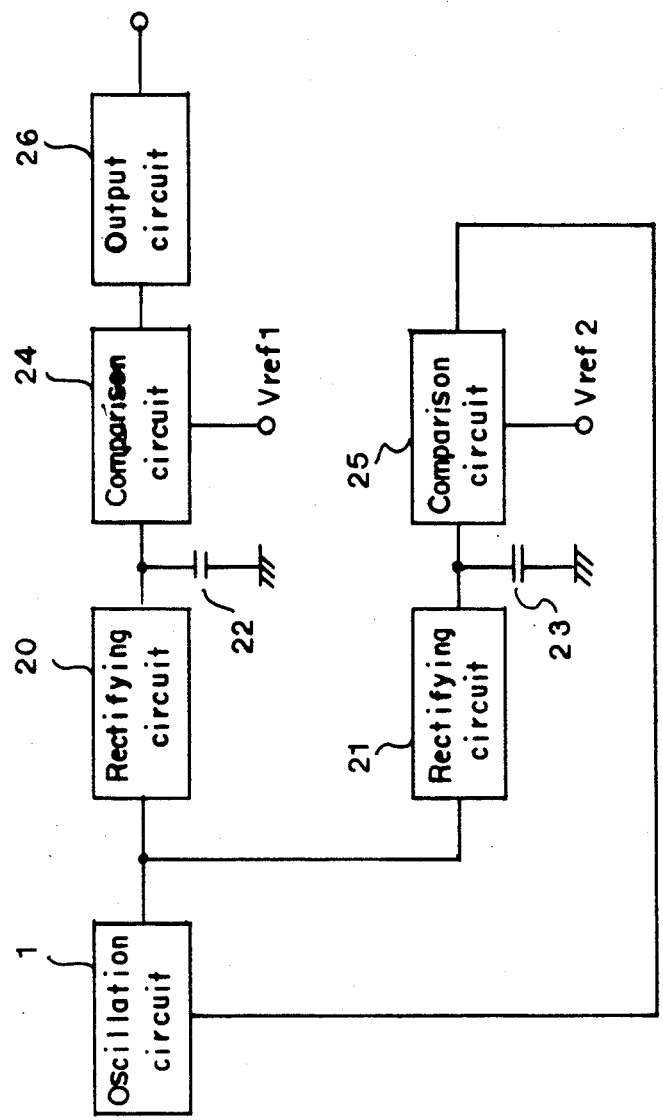
FIG. 2 is a block diagram showing the overall structure of the proximity switch according to the embodiment.

FIG. 2 is a block diagram showing the overall structure of the proximity switch according to this invention. In this drawing, the oscillation output of the oscillation circuit 1 shown in FIG. 1 is given to a pair of rectifying circuits 20 and 21. The rectifying circuits 20 and 21 convert the oscillation output into DC signals according to their time constants and their output ends are connected to capacitors 22 and 23 for smoothing having different capacitances and then to comparison circuits 24 and 25. The comparison circuits 24 and 25 are given with reference voltages Vref1 and Vref2 (Vref1>Vref2), respectively, which determine different threshold levels and convert the input signals into square wave signals.

When the input signal exceeds the reference voltage Vref1, the comparison circuit 24 produces an output and transmits the output to outside by way of an output circuit 26 as an object detection signal. Meanwhile, the comparison circuit 25, which is given with the reference voltage Vref2 which is lower than that of the other comparison circuit 24 and converts the input signal into a square wave signal, transmits a signal to the transistor 16 of the oscillation circuit 1 of FIG. 1 when the level is sufficiently high.

Now the action of this embodiment is described in the following.

Figure 3:
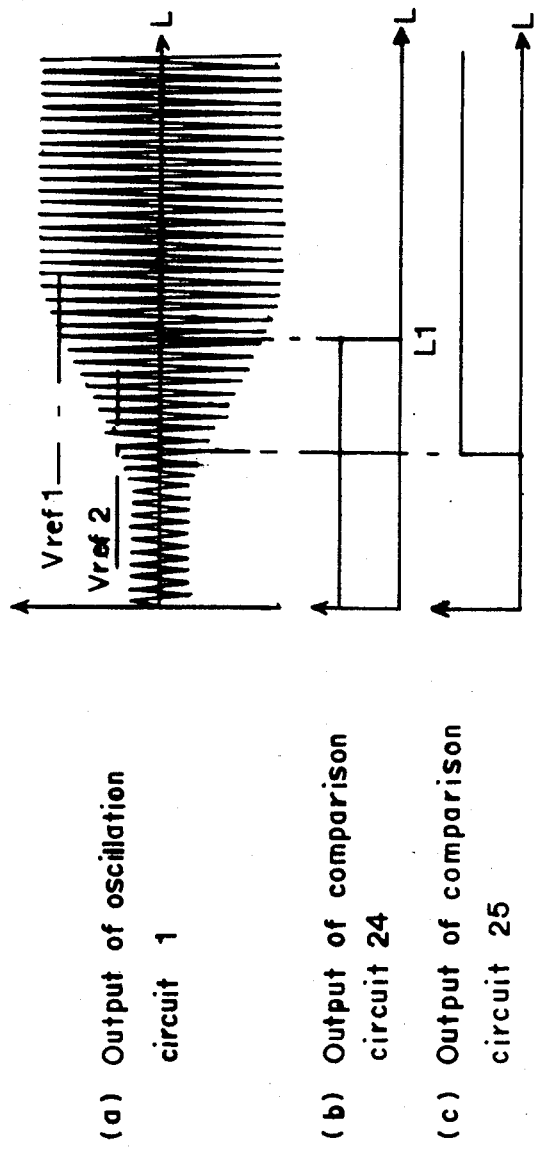
FIG. 3 is a wave form diagram for various parts of the proximity switch in relation with the distance between the proximity switch and an object to be detected.

FIG. 3 shows a diagram showing the waveforms of various parts in association with the distance between an approaching body and the detection coil of this embodiment. When the object is sufficiently far away, the coil L is without any substantial loss. In the oscillation circuit, the voltage of the LC resonance circuit is given to the transistor 4 for current amplification and collector current flows through the transistors 10 and 4. Due to this collector current, mirror current flows through the transistor 12 by way of the transistor 11. Then the mirror current is divided into four parts and three quarters of the mirror current is current fed back to the LC resonance circuit with the result that the oscillation circuit starts oscillation.

Now, suppose that the collector current of the transistor 4 is denoted as Io, the emitter currents and the current gains of the transistors 10 and 11 as Ie1 and Ie2, and hfe1 and hfe2, respectively, and the current gain of the transistor 12 as hfe3, then the current Io may be expressed as follows:

$$Io = \left(Ie1 - \frac{Ie1}{1 + hfe1}\right) + \frac{\frac{Ie1}{1 + hfe1} + Ie2}{1 + hfe3}$$

Since the base-emitter voltages of the transistors 10 and 11 are identical, Ie1=Ie2 (=Ie). And, if the current gains of the transistors 10, 11 and 12 are all equal to hfe, then $$Io = Ie\left(1 + \frac{1}{(1 + hfe)^2}\right) \quad (2)$$

And, if the current at the three collector terminals of the transistor 12 is Ia, then $$Io = \frac{3}{4}\left[\frac{Ie}{1 + hfe1} + Ie - \left(\frac{\frac{Ie}{1 + hfe1} + Ie}{1 + hfe3}\right)\right] \quad (3)$$

-continued $$= \tfrac{3}{4} Ie \left(1 - \frac{1}{(1 + hfe)^2}\right)$$

Therefore, from Equations (2) and (3), the ratio of Ia over Io may be expressed as follows.

$$\frac{Ia}{Io} = \frac{3}{4} \cdot \frac{1 - 1/(1 + hfe)^2}{1 + 1/(1 + hfe)^2} \quad (4)$$

Thus, by connecting the base of the transistor 12 which divides the mirror current of the current mirror circuits 10 and 11 to the collector of the transistor 10, the ratio of Ia to Io does not change to any appreciable extent even when the current gains of the transistors vary according to the changes in temperature. At this moment, since the object is far away and the oscillation level is high as shown in FIG. 3, the transistor 16, receiving a signal from the comparison circuit 25, is turned on. Therefore, the current mirror circuit CM3 is deactivated and there is no current feedback through the transistor 15 to the LC resonance circuit. As a result, the value of the current fed back to the LC resonance circuit is solely accounted for by the current of the three collectors 12a of the transistor 12, or Ia.

As the object approaches the proximity switch, the oscillation output of the oscillation circuit 1 declines rapidly as shown in FIG. 3(a). When the distance is L1 or when the output of the rectifying circuit 20 reaches the reference voltage level Vref1 of the comparison circuit 24, an object detection signal is produced from the output circuit 26.

When the object comes even closer to the proximity switch and the oscillation output declines below the reference voltage level Vref2 of the comparison circuit 25, the comparison output from the comparison circuit 25 is terminated and the switching transistor 16 of the oscillating circuit 1 is turned off. Then, the current mirror circuit CM3 formed by the transistors 13 and 14 turns into an active state and, by one of the collector currents Ib of the transistor 12 flowing into the current mirror circuit CM3, the transistor 14 starts driving the multi-collector transistor 15. Thus, the other collector currents of the multi-collector transistor 15 is current fed back to the LC resonance circuit.

If the emitter areas of the transistors 13 and 14 are equal to each other, the collector current Ic of the transistor 15 is substantially equal to Ib and the value of electric current flowing into the LC resonance circuit is the sum of the current of the three collectors of the transistors 12, Ia and Ic. Therefore, the feedback current If is increased and the gain of the oscillation circuit may be increased.

Here, the number of the connected collectors may be arbitrarily varied. By increasing the value of the current supplied from the collector of the transistor 12 to the current mirror circuit CM3, the feedback current may be increased. Furthermore, if the emitter areas of the transistors 13 and 14 are n1 and n2, respectively, then the current mirror circuit CM3 itself is cable of current amplification. Specifically, the feedback current If in this case may be given as follows:

$$If = Ia + \frac{n2}{n1} Ib \quad (5)$$

Thus, the current mirror circuit CM3 is capable of amplifying the feedback current and, as shown in FIG. 3, the oscillation may be maintained even if the object comes even closer to the proximity switch.

As indicated in Equation (1), the oscillation start response time tau is dependent on the amplitude in the initial stage, and the oscillation rise time may be drastically reduced if the initial amplitude level Vs is high. Thus, the oscillation rise time may be reduced by maintaining the oscillation at a low level even after the object has come close to the proximity switch and the object detection signal has been produced, as shown in FIG. 3(a).

Therefore, the response speed of the proximity switch may be increased by decreasing the capacitance of the capacitor provided at the output end of the rectifying circuit 20 or reducing the time constant of the smoothing circuit. This proximity switch may be used in an environment where a strong AC magnetic field is present as in the case of a resistance welder where electric current of great magnitude is used. In this case, the oscillation can start near the zero cross points of the AC magnetic field and the oscillation can be started up in a brisk manner. For instance, when a AC magnetic field of 60 Hz is present, a series of burst wave forms of double the frequency of the magnetic field or 120 Hz can be obtained from the oscillation circuit 1.

Therefore, by increasing the capacitance of the output capacitor of the rectifying circuit 20 to increase the discharge time constant, detecting the presence of the burst oscillations with the rectifying circuit having a large time constant and comparing the obtained signal with a certain threshold voltage in the comparison circuit 24, a proximity switch which can withstand magnetic field can be obtained. Thus, it is advantageous in this conjunction to have the time constant of the rectifying circuit for the first comparison circuit to be variable for the versatility of the proximity switch.

Although the present invention has been shown and described with reference to the preferred embodiment thereof, and in terms of the illustrative drawings, it should not be considered as limited thereby. Various possible modifications and alterations could be conceived of by one skilled in the art to any particular embodiment, without departing from the scope of the invention. Therefore it is desired that the scope of the present invention should be defined not by any of the perhaps purely fortuitous details of the shown preferred embodiment, or of the drawings, but solely by the scope of the appended claims, which follow.

What we claim is:

1. A proximity switch of high frequency oscillation type having a current feedback type oscillation circuit in which part of the oscillation current is fed back, and a detector circuit which detects an object from reduction in oscillation output, characterized in that:

then current feedback type oscillation circuit comprises an LC resonance circuit; a current mirror circuit consisting of a first transistor producing an oscillation current and a second transistor; a multi-collector transistor having a base connected to a collector of the first transistor, and an emitter receiving a mirror current from the second transistor; collectors of the multi-collector transistor dividing the mirror current into two portions, the first portion feeding back to the LC resonance circuit; a second current mirror circuit receiving the second portion; a third transistor which feeds back to the LC resonance circuit the output current of the second current mirror circuit along with the feedback current of the multi-collector transistor; and a switching device for suppressing the output of the second current mirror circuit;

the proximity switch further comprising a first comparison means for producing an object detection signal when the oscillation output of the oscillation circuit has declined below a first level, and a second comparison circuit which deactivates the switching device when the oscillation output of the oscillation circuit has declined below a second level which is lower than the first level.

2. A proximity switch as defined in claim 1, wherein the second current mirror circuit comprises a pair of transistors, the current gain of one of the transistors being greater than the current gain of the other transistor for amplifying the feedback current to the oscillation circuit.

3. A proximity switch as defined in claim 1, wherein a rectifying circuit with a certain time constant is provided between the output of the oscillation circuit and the first comparison circuit and the time constant is variable.

* * * * *